United States Patent
Leung et al.

(10) Patent No.: US 12,381,387 B1
(45) Date of Patent: Aug. 5, 2025

(54) TRANSIENT VOLTAGE SURGE PROTECTION CIRCUIT

(71) Applicant: Kinetic Technologies International Holdings LP, Toronto (CA)

(72) Inventors: Hiu Fai Leung, Hong Kong (CN); Chi Kin Wong, Hong Kong (CN); King Chun Fung, Hong Kong (CN)

(73) Assignee: Kinetic Technologies International Holdings LP, Toronto (CA)

( * ) Notice: Subject to any disclaimer, the term of this patent is extended or adjusted under 35 U.S.C. 154(b) by 143 days.

(21) Appl. No.: 18/371,777

(22) Filed: Sep. 22, 2023

(51) Int. Cl.
*H02H 9/00* (2006.01)
*H02H 9/04* (2006.01)
*H03K 17/06* (2006.01)
*H03K 17/081* (2006.01)

(52) U.S. Cl.
CPC ............ *H02H 9/005* (2013.01); *H02H 9/046* (2013.01); *H03K 17/063* (2013.01); *H03K 17/08104* (2013.01)

(58) Field of Classification Search
CPC ...... H02H 9/005; H02H 9/046; H03K 17/063; H03K 17/08104
USPC .......................................................... 361/56
See application file for complete search history.

(56) References Cited

U.S. PATENT DOCUMENTS

| | | | | |
|---|---|---|---|---|
| 5,986,861 | A * | 11/1999 | Pontarollo | H10D 89/601 361/91.5 |
| 6,614,633 | B1 * | 9/2003 | Kohno | H03K 17/0822 361/111 |
| 7,224,560 | B2 * | 5/2007 | May | H10D 89/811 361/111 |
| 8,854,103 | B2 * | 10/2014 | Willemen | H03K 17/08122 327/330 |
| 11,108,229 | B2 * | 8/2021 | Jang | H10D 89/819 |
| 11,322,932 | B2 * | 5/2022 | Sjökvist | H02H 9/041 |
| 2004/0109276 | A1 * | 6/2004 | Mendenhall | H03F 1/52 361/100 |
| 2008/0013231 | A1 * | 1/2008 | Bazzano | H10D 89/711 361/56 |
| 2012/0212869 | A1 * | 8/2012 | Shimomura | H02H 9/046 361/56 |
| 2013/0208380 | A1 * | 8/2013 | Hendricks | H02H 3/021 361/56 |

(Continued)

FOREIGN PATENT DOCUMENTS

| | | | | | |
|---|---|---|---|---|---|
| CN | 118117999 | A | * | 5/2024 | ......... H01L 27/0255 |
| DE | 102015224979 | A1 | * | 6/2016 | ....... G01R 19/16523 |

*Primary Examiner* — Dharti H Patel
(74) *Attorney, Agent, or Firm* — Sheppard Mullin Richter & Hampton LLP

(57) ABSTRACT

A transient voltage surge protection circuit includes a discharge transistor having a drain coupled to a first point of a voltage input bus, and a source coupled to ground; an RC string having a first capacitor and a first resistor coupled in series; a first charge transistor having a drain coupled to the drain of the discharge transistor, a source coupled to the gate of the discharge transistor, and a gate coupled to a mid-point between the first capacitor and the first resistor; a second charge transistor having a drain coupled to the drain of the discharge transistor and a gate coupled to the gate of the first charge transistor; a Zener diode string coupled to a second point of the voltage input bus and coupled to a third and fourth resistors in series. A midpoint between the third and fourth resistors is coupled to the second resistor.

20 Claims, 5 Drawing Sheets

(56) References Cited

U.S. PATENT DOCUMENTS

| | | | |
|---|---|---|---|
| 2016/0172846 A1* | 6/2016 | Kotani | H02H 9/04 |
| | | | 361/56 |
| 2019/0237967 A1* | 8/2019 | Knoedgen | H10D 89/611 |
| 2021/0083471 A1* | 3/2021 | Watanabe | H02H 7/122 |
| 2022/0384420 A1* | 12/2022 | Ikeda | H10D 89/811 |
| 2023/0093961 A1* | 3/2023 | Damodaran Prabha | |
| | | | H02H 9/004 |
| | | | 361/56 |

* cited by examiner

TRANSIENT VOLTAGE SURGE PROTECTION CIRCUIT

TECHNICAL FIELD

This disclosure is generally related to transient voltage surge protection circuits that can swiftly dispatch a voltage surge to protect internal circuits of a device.

BACKGROUND

If not protected, electronic circuitry often may suffer transient voltage surge that strikes the circuitry unexpectedly due to a large and short surge of voltage. This may lead to breakdown of the electronic circuitry and cause malfunctions to the device that employ the electronic circuitry. One of the common transient voltage surge is electrostatic discharge (ESD). Static electricity is often generated through tribocharging, where the separation of electric charges occurs when two materials are brought into contact and then separated. ESD may also be generated through electrostatic induction. This happens when an electrically charged object is placed near a conductive object that is isolated from the ground. Because ESD occurrence is hard to predict, sensitive electronic devices may be equipped with integrated ESD protection circuits.

SUMMARY

Described herein are transient voltage surge protection circuits that can swiftly respond to the transient voltage surge and provide a steady voltage input to internal circuits that the transient voltage surge protection circuits are designed to protect.

In one aspect, a transient voltage surge protection circuit is provided. The transient voltage surge protection circuit is coupled to a voltage input bus that receives and transmits the voltage input to the internal circuits. The transient voltage surge protection circuit includes a discharge transistor having a drain coupled to a first point of the voltage input bus, a source coupled to the ground, and a gate; an RC string having a first capacitor and a first resistor coupled in series, wherein a first terminal of the first capacitor is coupled to the drain of the discharge transistor, a second terminal of the first capacitor is coupled to a first terminal of the first resistor, and a second terminal of the first resistor is coupled to the gate of the discharge transistor; a first charge transistor having a drain coupled to the drain of the discharge transistor, a source coupled to the gate of the discharge transistor, and a gate coupled to a mid-point between the second terminal of the first capacitor and the first terminal of the first resistor; a second charge transistor having a drain coupled to the drain of the discharge transistor, a source, and a gate coupled to the gate of the first charge transistor; a second resistor coupled between the source of the first charge transistor and the source of the second charge transistor; a Zener diode string coupled to a second point of the voltage input bus; and a third resistor and a fourth resistor coupled in series with the Zener diode string. A midpoint between the third resistor and the fourth resistor is coupled to the second resistor. A terminal of the fourth resistor is coupled to the ground.

In some embodiments, a ratio of channel width to channel length of the discharge transistor is greater than each of ratios of channel width to channel length of the first charge transistor and the second charge transistor.

In some embodiments, the transient voltage surge protection circuit further includes a fifth resistor coupled between the second point of the voltage input bus and the Zener diode string.

In some embodiments, the first resistor has a resistance greater than each resistance of the second resistor, the third resistor, the fourth resistor, or the fifth resistor.

In some embodiments, a difference of the resistances of the third resistor and the fourth resistor is less than a difference of the first resistor and the third resistor.

In some embodiments, the transient voltage surge protection circuit further includes a third charge transistor having a drain coupled to a midpoint of the Zener diode string, a source coupled to the midpoint between the third resistor and the fourth resistor, and a gate coupled to the gate of the discharge transistor; and a sixth resistor coupled between the second resistor and the midpoint between the third resistor and the fourth resistor.

In some embodiments, the transient voltage surge protection circuit further includes a second capacitor having a first terminal coupled to the midpoint of the Zener diode string and a second terminal coupled to the gate of the first charge transistor.

In some embodiments, the Zener diode string comprises a plurality of Zener diodes. The midpoint of the Zener diode string is located between a last Zener diode of the Zener diode string coupled to the third resistor and other Zener diodes of the Zener diode string.

In some embodiments, the third charge transistor is coupled in parallel with a string of the last Zener diode and the third resistor.

In some embodiments, the first point of the voltage input bus is coupled to an internal circuit protected by the transient voltage surge protection circuit.

In some embodiments, the voltage output of the first point of the voltage input bus is clamped to the clamp voltage in about 1 µs after the transient voltage surge protection circuit receives a voltage surge.

In another aspect, a transient voltage surge protection circuit is provided. The transient voltage surge protection circuit is coupled to a voltage input bus that receives and transmits the voltage input to the internal circuits. The transient voltage surge protection circuit includes: a discharge transistor having a drain coupled to a first point of the voltage input bus, a source coupled to the ground, and a gate; a resistor-capacitor (RC) string having a first capacitor and a first resistor coupled in series, wherein a first terminal of the first capacitor is coupled to the drain of the discharge transistor, a second terminal of the first capacitor is coupled to a first terminal of the first resistor, and a second terminal of the first resistor is coupled to the gate of the discharge transistor; a first charge transistor having a drain coupled to the drain of the discharge transistor, a source coupled to the gate of the discharge transistor, and a gate coupled to a mid-point between the second terminal of the first capacitor and the first terminal of the first resistor; a second charge transistor having a drain coupled to the drain of the discharge transistor, a source, and a gate coupled to the gate of the first charge transistor; a second resistor coupled between the source of the first charge transistor and the source of the second charge transistor; a Zener diode string coupled to a second point of the voltage input bus; a third resistor and a fourth resistor coupled in series with the Zener diode string, wherein a midpoint between the third resistor and the fourth resistor is coupled to the second resistor, and wherein a terminal of the fourth resistor is coupled to the ground; a fifth resistor coupled between the second point of the voltage input bus and the Zener diode string; a third charge transistor having a drain coupled to a midpoint of the Zener diode string, a source coupled to the midpoint between the third resistor and the fourth resistor, and a gate coupled to the gate of the discharge transistor; and a sixth resistor coupled between the second resistor and the midpoint between the third resistor and the fourth resistor.

In some embodiments, a ratio of channel width to channel length of the discharge transistor is greater than each of ratios of channel width to channel length of the first charge transistor, the second charge transistor, and the third charge transistor.

In some embodiments, the first resistor has a resistance greater than each of the second resistor, the third resistor, the fourth resistor, the fifth resistor, or the sixth resistor.

In some embodiments, the transient voltage surge protection circuit further includes a second capacitor having a first terminal coupled to the midpoint of the Zener diode string and a second terminal coupled to the gate of the first charge transistor.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the disclosure are utilized, and the accompanying drawings of which:

DETAILED DESCRIPTION OF EMBODIMENTS

In the following description, certain specific details are set forth in order to provide a thorough understanding of various embodiments of the disclosure. However, one skilled in the art will understand that the disclosure may be practiced without these details. Moreover, while various embodiments of the disclosure are disclosed herein, many adaptations and modifications may be made within the scope of the disclosure in accordance with the common general knowledge of those skilled in this art. Such modifications include the substitution of known equivalents for any aspect of the disclosure in order to achieve the same result in substantially the same way.

Unless the context requires otherwise, throughout the present specification and claims, the word "comprise" and variations thereof, such as, "comprises" and "comprising" are to be construed in an open, inclusive sense, that is as "including, but not limited to." Recitation of numeric ranges of values throughout the specification is intended to serve as a shorthand notation of referring individually to each separate value falling within the range inclusive of the values defining the range, and each separate value is incorporated in the specification as it were individually recited herein.

Additionally, the singular forms "a," "an" and "the" include plural referents unless the context clearly dictates otherwise.

Reference throughout this specification to "one embodiment" or "an embodiment" means that a particular feature, structure or characteristic described in connection with the embodiment is included in at least one embodiment of the present disclosure. Thus, the appearances of the phrases "in one embodiment" or "in an embodiment" in various places throughout this specification are not necessarily all referring to the same embodiment, but may be in some instances. Furthermore, the particular features, structures, or characteristics may be combined in any suitable manner in one or more embodiments.

Various embodiments described herein are directed to transient voltage surge protection circuits that provide fast discharge of the transient voltage surge and stable voltage inputs to the internal circuits that the transient voltage surge protection circuits are configured to protect.

Figure 1:
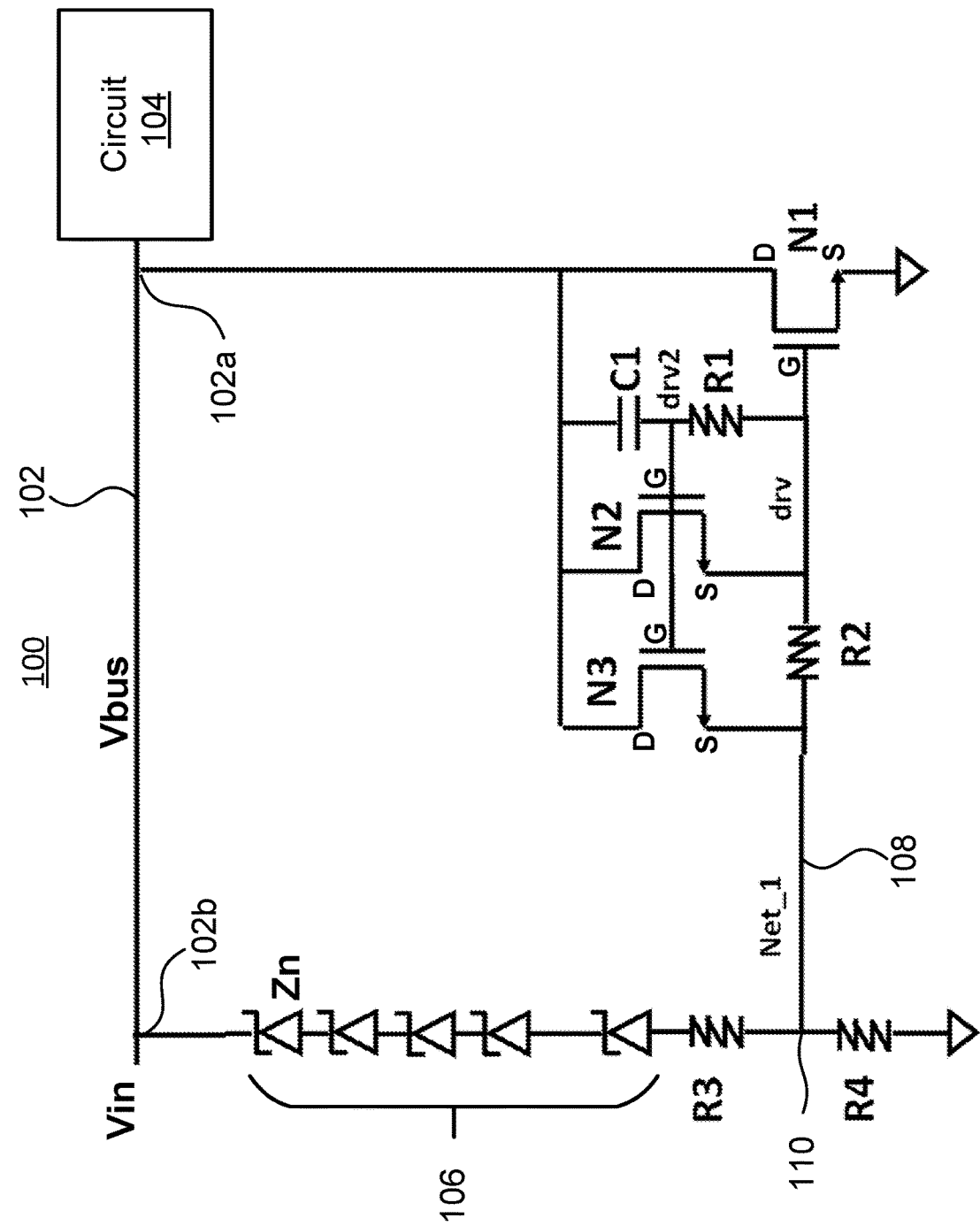
FIG. 1 is a circuit diagram depicting a voltage surge protection circuit, according to one example embodiment.

Embodiments will now be explained with accompanying figures. Reference is first made to FIG. 1. FIG. 1 is a circuit diagram depicting a voltage surge protection circuit 100, according to one example embodiment. The voltage surge protection circuit 100 is coupled to a voltage input bus 102 that receives and transmits the voltage input to a circuit 104. Circuit 104 can be an internal circuit of a device. The transient voltage surge protection circuit 100 includes a discharge transistor N1. The discharge transistor N1 has a drain coupled to a first point 102a of the voltage input bus 102, a source coupled to the ground, and a gate. The transient voltage surge protection circuit 100 further includes a resistor-capacitor (RC) string having a first capacitor C1 and a first resistor R1 coupled in series. A first terminal of the first capacitor C1 is coupled to the drain of the discharge transistor N1. A second terminal of the first capacitor C1 is coupled to a first terminal of the first resistor R1. A second terminal of the first resistor R1 is coupled to the gate of the discharge transistor N1.

The transient voltage surge protection circuit 100 further includes a first charge transistor N2. The first charge transistor N2 has a drain coupled to the drain of the discharge transistor N1, a source coupled to the gate of the discharge transistor N1, and a gate coupled to a mid-point between the second terminal of the first capacitor C1 and the first terminal of the first resistor R1. The transient voltage surge protection circuit 100 further includes a second charge transistor N3. The second charge transistor N3 has a drain coupled to the drain of the discharge transistor N1, a source, and a gate coupled to the gate of the first charge transistor N2. The transient voltage surge protection circuit 100 further includes a second resistor R2 coupled between the source of the first charge transistor N2 and the source of the second charge transistor N3. The transient voltage surge protection circuit 100 further includes a Zener diode string 106 coupled to a second point 102b of the voltage input bus 102. The transient voltage surge protection circuit 100 further includes a third resistor R3 and a fourth resistor R4 coupled in series with the Zener diode string 106. A midpoint 110 between the third resistor R3 and the fourth resistor R4 is coupled to the second resistor R2. A terminal of the fourth resistor R4 is coupled to the ground. The "midpoint" as used in this disclosure means any point between two components and does not necessarily mean the middle point between the two components.

The operations of the transient voltage surge protection circuit 100 is explained herein. When a transient voltage surge is present at the voltage input bus 102, the transient voltage surge charges the first capacitor C1, pulling up the voltage drv2. When the voltage drv2 is greater than the threshold voltage of the gate of the first charge transistor N2, the first charge transistor N2 is turned on, allowing the current from the input bus Vbus to charge the gate of the discharge transistor N1 and pulling up the voltage drv. When the voltage drv is greater than the threshold voltage of the gate of the discharge transistor N1, the discharge transistor N1 is turned on to discharge the transient voltage surge from the input bus Vbus to the ground. Moreover, the voltage drv2 also turns on the gate of the second charge transistor N3, allowing the second charge transistor N3 to pull up the voltage Net_1 at the network 108. The second resistor R2 is disposed between the source of the first charge transistor N2 and the second charge transistor N3 to reduce the current leakage from the source of the first charge transistor N2 to the network 108 and to the ground through the fourth resistor R4. This helps swiftly turn on the gate of the discharge transistor N1 as less current leakage from the source of the first charge transistor N2 lost to the ground. Further, the charging at the network 108 pulling up the voltage Net_1 also reduces the current leakage from the source of the first charge transistor N2 to the network 108 and to the ground.

The Zener string 106 is configured to regulate the transient voltage surge. The Zener diode string 106 may include one or more Zener diodes connected in series. Although the Zener diode string 106 as shown in FIG. 1 includes five Zener diodes Zn, it is to be understood that more or fewer Zener diodes may be included in the Zener diode string 106. In some embodiments, each of the Zener diodes Zn may have a same or similar breakdown voltage, e.g., 1V, 2V, 3V, 4V, 5V, 6V, 10V, 15V, 20V, etc. For the sake of explaining the operation of the transient voltage surge protection circuit 100, it is assumed that each Zener diode Zn has a breakdown voltage of 6V. The Zener diode string 106 in FIG. 1 thus has a combined breakdown voltage of 30V. When the transient voltage surge is greater than the combined breakdown voltage of 30V of the Zener diode string 106, the current flows from the second point 102b of the voltage input bus 102 through R3 and charges the network 108. This further reduces the current leakage from the source of the first charge transistor N2 to the network 108. The techniques disclosed herein can quickly turn on the discharge transistor N1 to discharge the transient voltage surge by the voltage drv charged by the first charge transistor N2 and by reducing current leakage from the source of the first charge transistor N2. The current leakage is reduced by the second resistor R2 disposed between the source of the first charge transistor and the source of the second charge transistor and by the charging from the second charge transistor N3 and the Zener diode string 106.

To quickly discharge the transient voltage surge, a ratio of channel width to channel length (W/L) of the discharge transistor N1 can be greater than each of ratios of channel width to channel length of the first charge transistor N2 and the second charge transistor N3. In some embodiments, the W/L ratio of the discharge transistor N1 is configured to be at least one order greater than that of the first charge transistor N2 or the second charge transistor N3. In some embodiments, the W/L ratio of the discharge transistor N1 may be 10,000-5,000,000. For example, the W/L ratio of the discharge transistor N1 may be 10,000, 20,000, 30,000, 40,000, 50,000, 60,000, 70,000, 80,000, 90,000, 100,000, 200,000, 300,000, 400,000, 500,000, 600,000, 700,000, 800,000, 900,000, 1,000,000, 2,000,000, 3,000,000, 4,000,000, or 5,000,000, or between any two of the above numbers. Each of the W/L ratio of the first charge transistor N2 or the second charge transistor N3 may be 100-100,000. For example, each of the W/L ratio of the first charge transistor N2 or the second charge transistor N3 may be 100, 200, 300, 400, 500, 600, 700, 800, 900, 1000, 2000, 3000, 4000, 5000, 6000, 7000, 8000, 9000, 10,000, 20,000, 30,000, 40,000, 50,000, 60,000, 70,000, 80,000, 90,000, or 100,000, or between any two of the above numbers.

In some embodiments, to prevent accidental discharge of the input voltage that is normal for driving the circuit 104, the first resistor R1 is configured to have a resistance greater than each resistance of the second resistor R2, the third resistor R3, and the fourth resistor R4. In some embodiments, the resistance of the first resistor R1 may be at least one order greater than each resistance of the second resistor R2, the third resistor R3, and the fourth resistor R4. In some embodiments, the resistance of the first resistor R1 may be 1000Ω-5000 kΩ, while the resistance of each of the second resistor R2, the third resistor R3, and the fourth resistor R4 may be 100Ω-500 kΩ. In some embodiments, a difference of the resistances of the third resistor R3 and the fourth resistor R4 is less than a difference of the first resistor R1 and the third resistor R3 (or the fourth resistor R4).

Figure 2:
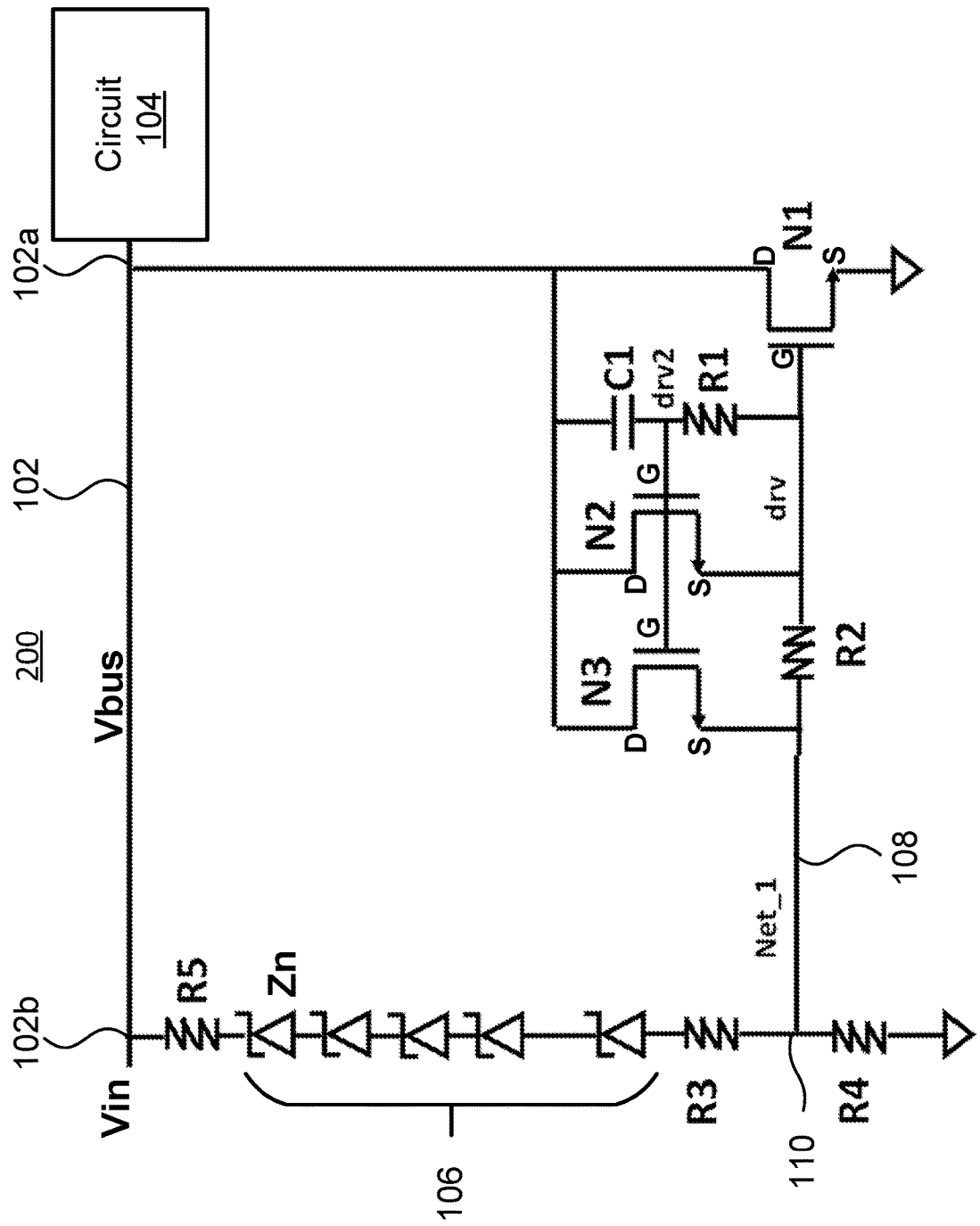
FIG. 2 is a circuit diagram depicting another voltage surge protection circuit, according to one example embodiment.

Reference is now made to FIG. 2. FIG. 2 is a circuit diagram depicting another voltage surge protection circuit 200, according to one example embodiment. The voltage surge protection circuit 200 is similar to the voltage surge protection circuit 100 as depicted in FIG. 1, except the voltage surge protection circuit 200 further includes a fifth resistor R5 coupled between the second point on the voltage input bus 102 and the Zener diode string 106. The fifth resistor R5 is configured to further fine tune the combined breakdown voltage provided by the Zener diode string 106. In the illustrated embodiment, the fifth resistor R5 may be 100Ω-500 kΩ.

Figure 3:
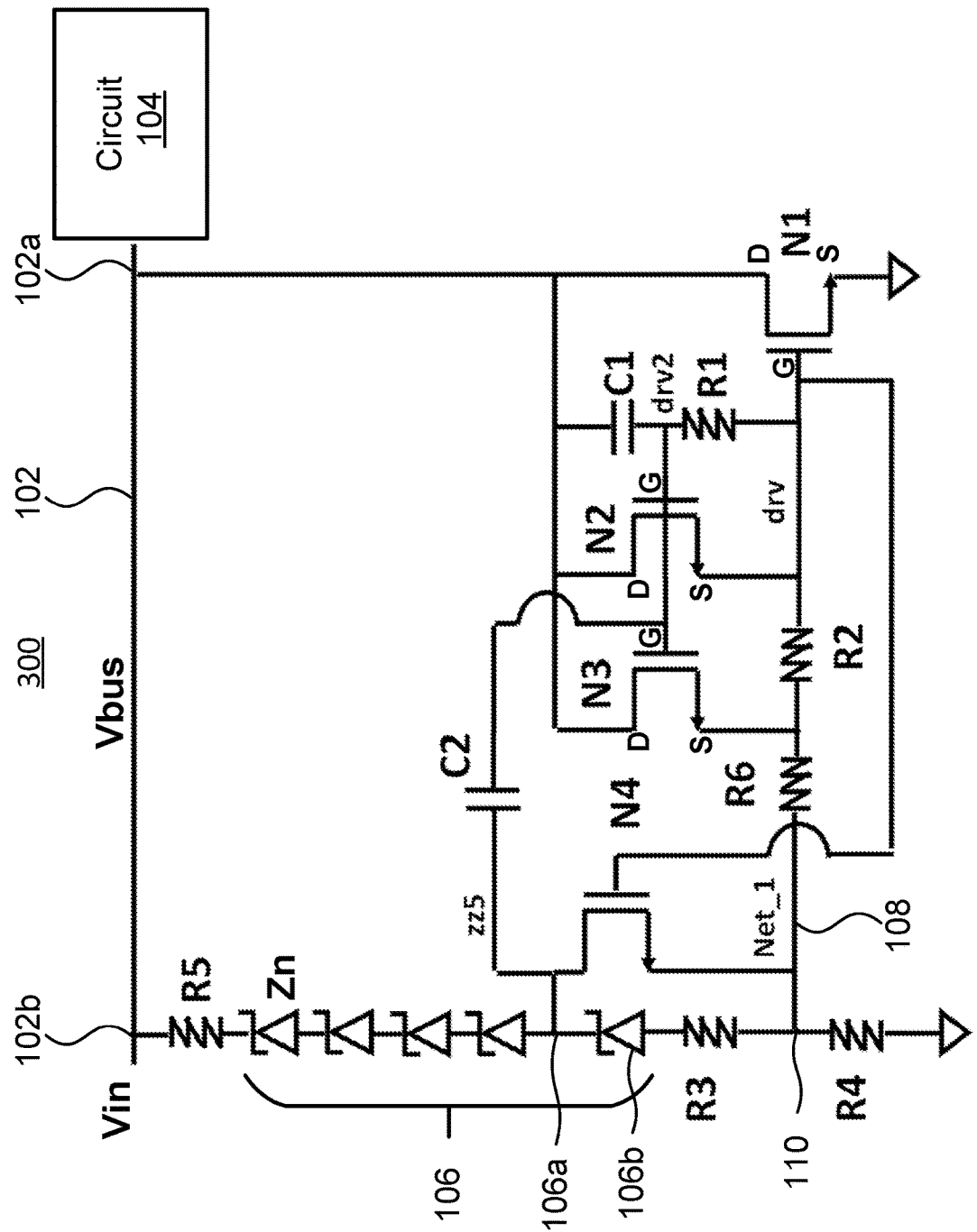
FIG. 3 is a circuit diagram depicting yet another voltage surge protection circuit, according to one example embodiment.

FIG. 3 is a circuit diagram depicting another voltage surge protection circuit 300, according to one example embodiment. The voltage surge protection circuit 300 is based on the voltage surge protection circuit 200 as depicted in FIG. 2 and includes other components as will be explained below. In addition to the discharge transistor N1, the first charge transistor N2, the second charge transistor N3, the resistors R1-R5, and the first capacitor C1, the voltage surge protection circuit 300 further includes a third charge transistor N4. The third charge transistor N4 has a drain coupled to a midpoint 106a of the Zener diode string 106, a source coupled to the midpoint 110 between the third resistor R3 and the fourth resistor R4, and a gate coupled to the gate of the discharge transistor N1. The voltage surge protection circuit 300 further includes a sixth resistor R6 coupled between the second resistor R2 and the midpoint 110 between the third resistor R3 and the fourth resistor R4. The voltage surge protection circuit 300 further includes a second capacitor C2. The second capacitor C2 has a first terminal coupled to the midpoint 106a of the Zener diode string 106 and a second terminal coupled to the gate of the first charge transistor N2. The source of the second charge transistor N3 is coupled between the second resistor R2 and the sixth resistor R6.

In some embodiments, the midpoint 106a of the Zener diode string 106 is located between a last Zener diode 106b of the Zener diode string 106 coupled to the third resistor and the other Zener diodes of the Zener diode string 106. As shown in FIG. 3, the third charge transistor N4 is coupled in parallel with a string of the last Zener diode 106b and the third resistor R3 such that the gate of the third charge transistor N4 is turned on, the current is directed from the fifth resistor R5, to the upper portion of the Zener diode string 106, and to the third charge transistor N4, to charge the network 108. The gate of the third charge transistor N4 is turned on when the voltage drv to the gate of the discharge transistor N1 is equal to or greater than the threshold voltage of the gate of the third charge transistor N4. The charging from the third charge transistor N4 further reduces the current leakage from the source of the first charge transistor N2 that pull up the voltage drv.

The current from the midpoint 106a of the Zener diode string 106 also charges the second capacitor C2 that further pulls up the voltage at the gates of the first charge transistor N2 and the second charge transistor N3. The addition of the second capacitor C2 in the circuit reduces the time needed to turn on the first charge transistor N2 and the second charge transistor N3. An additional current from the Zener diode string 106 through the third resistor R3 also charges the network 108 to pull up the voltage Net_1. This configuration reduces leakage from the sources of the first charge transistor N2 and the second charge transistor N3 and leakage from the gate of the discharge transistor N1. This configuration further reduces the time needed for first charge transistor N2 and the second charge transistor N3 to charge drv and the midpoint between the second resistor R2 and the sixth resistor R6.

In some embodiments, the transistors N1-N4 may be n-type metal-oxide-semiconductor field-effect transistor (NMOSFET) or p-type metal-oxide-semiconductor field-effect transistor (PMOSFET). The capacitors C1 and C1 may each be 100 fF-10 pF.

The disclosed transient voltage surge protection circuits can also clamp the voltage output from the first point 102a of the voltage input bus to a stable clamp voltage. The disclosed voltage surge protection circuits can swiftly discharge the transient voltage surge, for example in about 1 µs after the transient voltage surge protection circuit receives a voltage surge.

Figure 4A:
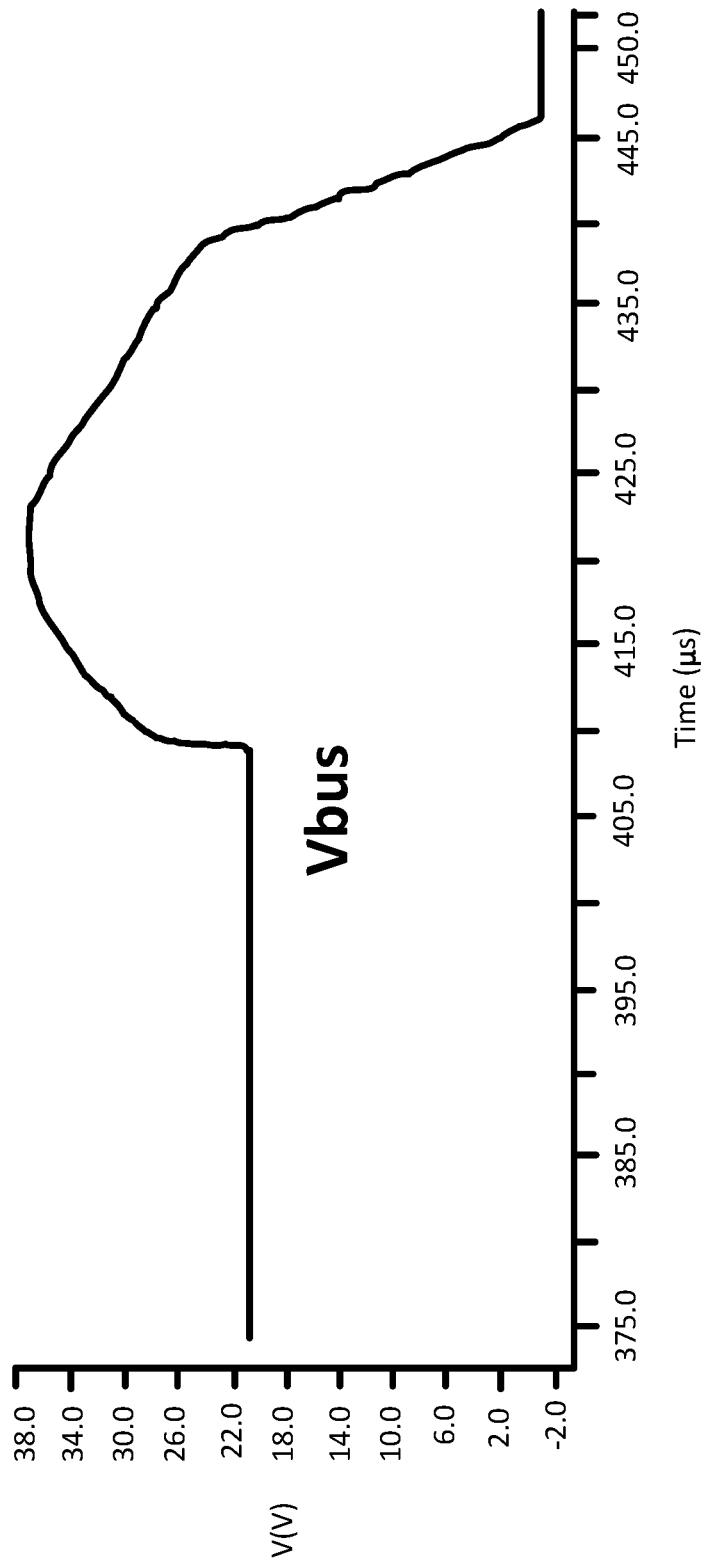
FIG. 4A depicts a transient voltage surge.
Figure 4B:
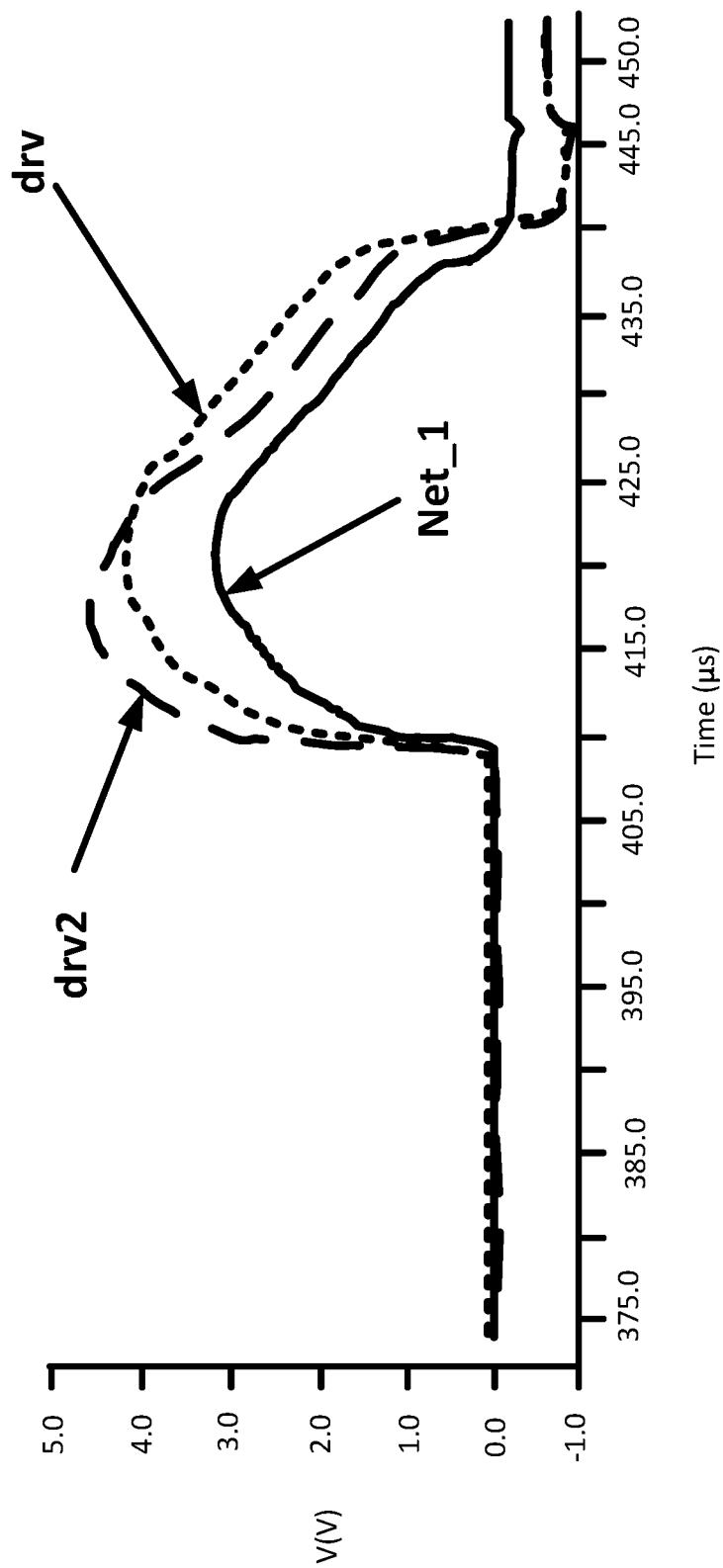
FIG. 4B shows simulation results of the voltage surge protection circuit as shown in FIG. 3 based on the transient voltage surge of FIG. 4A.

FIG. 4 shows a simulation of the operation of the transient voltage surge protection circuits according to some embodiments. As shown in FIGS. 3 and 4, when a transient voltage surge Vbus appears on voltage input bus 102, it pulls up the voltage drv2 first, which then turns on the gates of the first and second charge transistors and allows drv to be pulled up, which turns on the discharge transistor N1 to discharge the voltage surge. As the voltage surge is discharged through the discharge transistor N1 to the ground, drv and drv2 are also pulled down. At the beginning of the discharge, drv2 is greater than drv. drv is pulled up by N1's gate-drain capacitance (Cgd), and the resistors R2/R6 increase the effect of AC coupling. drv2 is pulled up by C1. In some embodiments, N2 injects ~4 mA current to charge drv. At some point during the discharge, drv becomes greater than drv2.

To hold the voltage drv, currents are directed to the midpoint between R2 and R6 and to the network 108 through the Zener diode string 106. This is achieved by using N4. N4 provides an additional current path from the Zener diodes and charge the network 108. A large current is sourced from N4 to Net_1. Net_1 is pulled up, and leakage form gate of N1 can be reduced. In addition, when Vbus goes up, voltage at zz5 (FIG. 3) is pulled up, and the current is injected to drv2 by C2. This extra current increases drv2 voltage, and N2 can inject additional current to drv. As such, drv can be maximized and the Vbus clamp voltage is optimized.

The foregoing description of the present disclosure has been provided for the purposes of illustration and description. It is not intended to be exhaustive or to limit the disclosure to the precise forms disclosed. The breadth and scope of the present disclosure should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the disclosure and its practical application, thereby enabling others skilled in the art to understand the disclosure for various embodiments and with various modifications that are suited to the particular use contemplated. It is intended that the scope of the disclosure be defined by the following claims and their equivalence.

What is claimed is:

1. A transient voltage surge protection circuit comprising:
    a discharge transistor having a drain coupled to a first point of a voltage input bus, a source coupled to the ground, and a gate;
    a resistor-capacitor string having a first capacitor and a first resistor coupled in series, wherein a first terminal of the first capacitor is coupled to the drain of the discharge transistor, a second terminal of the first capacitor is coupled to a first terminal of the first resistor, and a second terminal of the first resistor is coupled to the gate of the discharge transistor;
    a first charge transistor having a drain coupled to the drain of the discharge transistor, a source coupled to the gate of the discharge transistor, and a gate coupled to a mid-point between the second terminal of the first capacitor and the first terminal of the first resistor;
    a second charge transistor having a drain coupled to the drain of the discharge transistor, a source, and a gate coupled to the gate of the first charge transistor;
    a second resistor coupled between the source of the first charge transistor and the source of the second charge transistor;
    a Zener diode string coupled to a second point of the voltage input bus; and
    a third resistor and a fourth resistor coupled in series with the Zener diode string, wherein a midpoint between the third resistor and the fourth resistor is coupled to the second resistor, and wherein a terminal of the fourth resistor is coupled to the ground.

2. The transient voltage surge protection circuit of claim 1, wherein a ratio of channel width to channel length of the discharge transistor is greater than each of ratios of channel width to channel length of the first charge transistor and the second charge transistor.

3. The transient voltage surge protection circuit of claim 1, further comprising a fifth resistor coupled between the second point of the voltage input bus and the Zener diode string.

4. The transient voltage surge protection circuit of claim 3, wherein the first resistor has a resistance greater than each resistance of the second resistor, the third resistor, the fourth resistor, or the fifth resistor.

5. The transient voltage surge protection circuit of claim 1, wherein a difference of the resistances of the third resistor and the fourth resistor is less than a difference of the first resistor and the third resistor.

6. The transient voltage surge protection circuit of claim 1, further comprising:
    a third charge transistor having a drain coupled to a midpoint of the Zener diode string, a source coupled to the midpoint between the third resistor and the fourth resistor, and a gate coupled to the gate of the discharge transistor; and a sixth resistor coupled between the second resistor and the midpoint between the third resistor and the fourth resistor.

7. The transient voltage surge protection circuit of claim 6, wherein the source of the second charge transistor is coupled between the second resistor and the sixth resistor.

8. The transient voltage surge protection circuit of claim 7, further comprising:
a second capacitor having a first terminal coupled to the midpoint of the Zener diode string and a second terminal coupled to the gate of the first charge transistor.

9. The transient voltage surge protection circuit of claim 8, wherein the Zener diode string comprises a plurality of Zener diodes, wherein the midpoint of the Zener diode string is located between a last Zener diode of the Zener diode string coupled to the third resistor and the other Zener diodes of the Zener diode string.

10. The transient voltage surge protection circuit of claim 9, wherein the third charge transistor is coupled in parallel with a string of the last Zener diode and the third resistor.

11. The transient voltage surge protection circuit of claim 1, wherein the first point of the voltage input bus is coupled to an internal circuit of a device protected by the transient voltage surge protection circuit.

12. The transient voltage surge protection circuit of claim 1, wherein a voltage output of the first point of the voltage input bus is clamped to a clamp voltage.

13. The transient voltage surge protection circuit of claim 12, wherein the voltage output of the first point of the voltage input bus is clamped to the clamp voltage in about 1 μs after the transient voltage surge protection circuit receives a voltage surge.

14. A transient voltage surge protection circuit comprising:
a discharge transistor having a drain coupled to a first point of a voltage input bus, a source coupled to the ground, and a gate;
a resistor-capacitor string having a first capacitor and a first resistor coupled in series, wherein a first terminal of the first capacitor is coupled to the drain of the discharge transistor, a second terminal of the first capacitor is coupled to a first terminal of the first resistor, and a second terminal of the first resistor is coupled to the gate of the discharge transistor;
a first charge transistor having a drain coupled to the drain of the discharge transistor, a source coupled to the gate of the discharge transistor, and a gate coupled to a mid-point between the second terminal of the first capacitor and the first terminal of the first resistor;
a second charge transistor having a drain coupled to the drain of the discharge transistor, a source, and a gate coupled to the gate of the first charge transistor;
a second resistor coupled between the source of the first charge transistor and the source of the second charge transistor;
a Zener diode string coupled to a second point of the voltage input bus;
a third resistor and a fourth resistor coupled in series with the Zener diode string, wherein a midpoint between the third resistor and the fourth resistor is coupled to the second resistor, and wherein a terminal of the fourth resistor is coupled to the ground;
a fifth resistor coupled between the second point and the Zener diode string;
a third charge transistor having a drain coupled to a midpoint of the Zener diode string, a source coupled to the midpoint between the third resistor and the fourth resistor, and a gate coupled to the gate of the discharge transistor; and
a sixth resistor coupled between the second resistor and the midpoint between the third resistor and the fourth resistor.

15. The transient voltage surge protection circuit of claim 14, wherein a ratio of channel width to channel length of the discharge transistor is greater than each of ratios of channel width to channel length of the first charge transistor, the second charge transistor, and the third charge transistor.

16. The transient voltage surge protection circuit of claim 14, wherein the first resistor has a resistance greater than each resistance of the second resistor, the third resistor, the fourth resistor, the fifth resistor, or the sixth resistor.

17. The transient voltage surge protection circuit of claim 14, wherein a difference of the resistances of the third resistor and the fourth resistor is less than a difference of the first resistor and the third resistor.

18. The transient voltage surge protection circuit of claim 14, further comprising:
a second capacitor having a first terminal coupled to the midpoint of the Zener diode string and a second terminal coupled to the gate of the first charge transistor.

19. The transient voltage surge protection circuit of claim 18, wherein the Zener diode string comprises a plurality of Zener diodes, wherein the midpoint of the Zener diode string is located between a last Zener diode of the Zener diode string coupled to the third resistor and the other Zener diodes of the Zener diode string.

20. The transient voltage surge protection circuit of claim 19, wherein the third charge transistor is coupled in parallel with a string of the last Zener diode and the third resistor.

* * * * *